United States Patent [19]

Rehfeldt

[11] 4,360,786
[45] Nov. 23, 1982

[54] VARIABLE-GAIN DIFFERENTIAL AMPLIFIER

[75] Inventor: Karl H. Rehfeldt, Quickborn, Fed. Rep. of Germany

[73] Assignee: U.S. Philips Corporation, New York, N.Y.

[21] Appl. No.: 209,632

[22] Filed: Nov. 24, 1980

[30] Foreign Application Priority Data

Dec. 21, 1979 [DE] Fed. Rep. of Germany ....... 2951637

[51] Int. Cl.³ .......................... H03F 3/45; H04N 9/535
[52] U.S. Cl. ..................................... 330/254; 330/257
[58] Field of Search .................. 330/254, 257; 358/27

[56] References Cited

FOREIGN PATENT DOCUMENTS 2,813,856 10/1979 Fed. Rep. of Germany ...... 330/257

*Primary Examiner*—James B. Mullins
*Assistant Examiner*—Gene Wan
*Attorney, Agent, or Firm*—Thomas A. Briody; William J. Streeter; Laurence A. Wright

[57] ABSTRACT

A variable-gain differential amplifier comprises a first long-tailed transistor pair between the bases of which the input signal is applied. The emitter-collector paths of the transistors of the first pair are included in the tails of second and third long-tailed transistor pairs respectively, and load resistors between the lower terminals of which the output signal appears are included in the respective collector circuits of one transistor of each of the second and third pairs, and hence in the collector circuits of the respective transistors of the first pair. The second and third pairs are controlled by a gain control signal thereby diverting a variable proportion of the collector signal currents of the transistors of the first pair away from the load resistors (17,18) and hence varying the gain of the circuit. In order that variations in the gain control signal should not affect the d.c. level at the amplifier output the collectors of the other transistors of the second and third pairs are commoned and connected to the input of a current splitter the two output currents of which are fed to the respective load resistors, thereby compensating for any changes in the standing currents through the load resistors which would otherwise be produced by changes in the gain control voltage.

7 Claims, 2 Drawing Figures

VARIABLE-GAIN DIFFERENTIAL AMPLIFIER

The invention relates to a variable-gain differential amplifier circuit arrangement comprising first and second long-tailed pairs of transistors, a current source circuit to a control input of which the amplifier input is coupled, which current source circuit has first and second output current paths included in the tails of the first and second said long-tailed pairs respectively and is constructed so that the currents in said output current paths will vary in mutually opposite senses in response to the application of a signal to the amplifier input, first and second d.c. load impedances included in the output electrode circuits of one transistor of the first pair and one transistor of the second pair respectively, a gain control input coupled to the control electrodes of the transistors of the first and second pairs in such manner that the application of a gain control signal to said input will result in said one transistor of the first pair and said one transistor of the second pair being driven in the same sense and in the other transistor of the first pair and the other transistor of the second pair being driven in the opposite sense, and means for maintaining the standing voltages at those terminals of said load impedances which are connected to the output electrodes of the one transistor of the first pair and the one transistor of the second pair respectively substantially independent of the value of said gain control signal.

The terms "input electrode", "output electrode" and "control electrode" are to be understood to mean the "emitter", "collector" and "base" for bipolar transistors and the "source", "drain" and "gate" for field effect transistors.

BACKGROUND OF THE INVENTION

In the arrangements of this kind disclosed in German Offenlegungsschriften 27 23 750 and 28 13 856 the said means is arranged to adjust the potential at a point to which the other terminals of the load impedances are connected in accordance with the value of the gain control signal, so as to compensate for changes which would otherwise occur in said standing voltages.

OBJECT OF THE INVENTION

It is the object of the invention to provide alternative arrangement of the above kind which can be simpler.

SUMMARY OF THE INVENTION

The invention provides a current divider circuit to the input of which are connected the output electrodes of said other transistors of the first and second pairs, said current divider circuit having first and second outputs connected to the said terminal of the first load impedance and the said terminal of the second load impedance respectively.

It has now been recognised that it can sometimes be simpler to adjust the voltage on a given terminal of a d.c. impedance by changing the current through the impedance rather than by changing the potential at its other terminal.

BRIEF DESCRIPTION OF THE DRAWINGS

Embodiments of the invention will be described, by way of example, with reference to the accompanying diagrammatic drawing, in which.

DETAILED DESCRIPTION OF THE PREFERRED EMBODIMENTS

Figure 1:
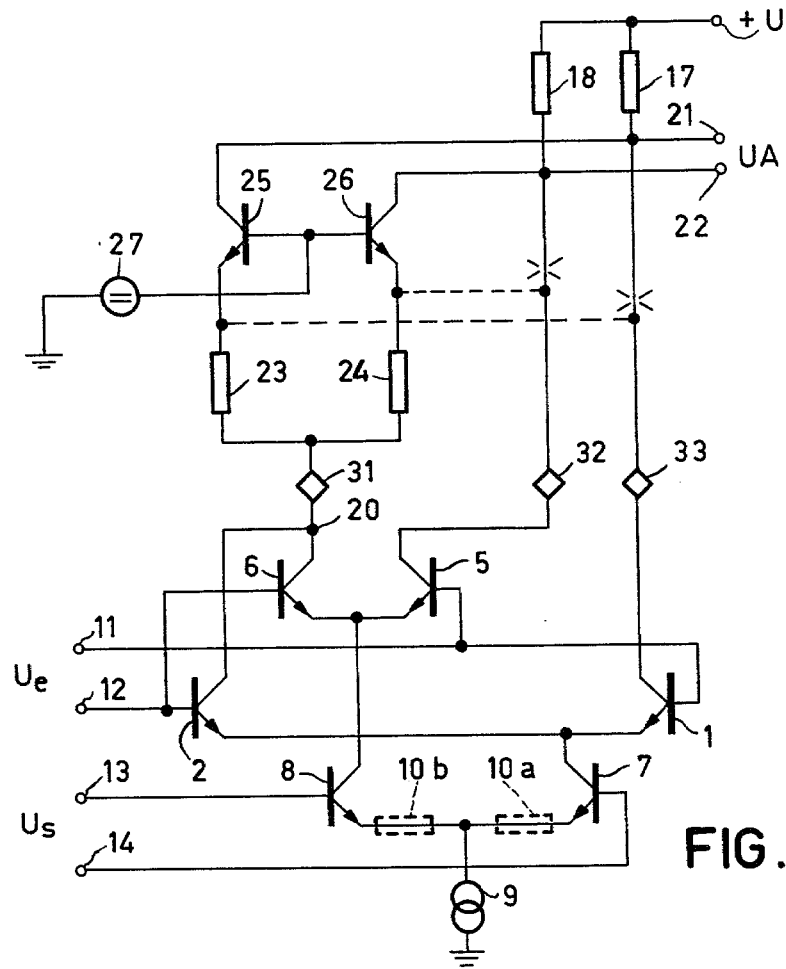
FIG. 1 shows a first embodiment.

In the variable-gain differential amplifier circuit arrangement shown in FIG. 1 two npn-transistors 1 and 2 constitute a first differential amplifier or long-tailed pair, their bases being connected to terminals 11 and 12 respectively, across which a gain control signal $U_e$ is applied. The emitters of the transistors 1 and 2 are interconnected and are connected to the collector of an npn-transistor 7.

Two npn-transistors 5 and 6 constitute a second differential amplifier or long-tailed pair, their bases also being connected to the gain control signal input terminals 11 and 12, respectively. The emitters of the transistors 5 and 6 are interconnected and connected to the collector of a transistor 8. The interconnected emitters of the transistors 7 and 8 together receive an at least substantially constant direct current from a current source 9 which is connected between them and earth. The bases of transistors 8 and 7 are connected to terminals 13 and 14 respectively, across which an a.c. input signal $U_s$ is applied. The emitter leads of the transistors 7 and 8 may include resistors 10a and 10b respectively, in order to obtain an improved drive-signal handling range. It will be seen that the components 7–10 form a controllable current source circuit having two outputs, the currents at which vary in mutually opposite senses in response to variations in the input signal $U_s$.

The collectors of the transistors 1 and 5 are connected to the positive terminal + of a power supply source U, via d.c. load impedances 17 and 18 respectively. These impedances, which may each exhibit a reactive component, may each be constituted by a load resistor of 1 k Ohm.

The emitters of the transistors 1 and 5 receive signal currents of mutually opposite phase from the transistors 7 and 8 respectively, so that signal voltages of mutually opposite phase develop across the output impedances 17 and 18. The difference between these voltages constitutes the output voltage $U_a$ of the arrangement, this voltage appearing across terminals 21 and 22 which are connected to the collectors of the transistors 1 and 5, respectively.

The two other transistors 2 and 6 of the two differential pairs 1, 2 and 5,6 have interconnected collectors. Their emitters receive signal currents of mutually opposite phase from the transistors 7 and 8 respectively, so that the signal components in their common collector lead 20, which carries both collector currents, cancel each other. Because the bases of transistors 2 and 6 are connected to the same gain control signal input terminal 12, the gain control signal $U_e$ controls the current in the lead 20. Because the bases of the transistors 1 and 5 are both connected to the other gain control input terminal 11, the gain control voltage $U_e$ influences the currents carried by the transistors 1 and 2 in a contrary sense, which transistors transfer the a.c. signal to the load impedances 17 and 18. The gain control voltage $U_e$ therefore controls the differential amplifiers 1, 2 and 5, 6 in such manner that its value determines the extent to which the a.c. signal current supplied by the transistors 7 and 8 is transferred to the load impedances 17 and 18. Unless further steps were taken, a change in the value of the control signal $U_e$ would also result in a change in the standing current through the load impedances 17 and 18, so that the d.c. level at the output terminals 21 and 22 would be dependent on the value of the gain control signal $U_e$ across the terminals 11 and 12.

In order to prevent this from happening the sum of the collector currents of transistors 2 and 6, which sum flows in the lead 20 and does not contain any component arising from input signal $U_s$, is divided into two portions by means of a current divider, and these portions are applied to the output terminals 21 and 22, respectively, i.e. to the load resistors 17 and 18 respectively.

The said divider includes two resistors 23 and 24 which are connected between the line 20 and the emitters of npn-transistors 25 and 26 respectively. The bases of these transistors are interconnected and connected to a fixed direct voltage produced by a source 27, which may for example be constituted by a voltage divider connected across the power-supply voltage U. As the lower ends of the resistors 23 and 24 are at the same potential, as are the bases of the transistors 25 and 26, the current carried by the line 20 is divided between the transistors 25 and 26 in a ratio which is substantially the inverse of the ratio of the values of the resistors 23 and 24. If, for example, the resistors have equal values, the current will be divided in the ratio 1:1, the two portions flowing to the output terminals 21 and 22 respectively, i.e. to the resistors 17 and 18 respectively if any external load connected to the terminals 21 and 22 is negligible. As the standing current in the line 20 and the standing currents in the collector leads of the transistors 1 and 5 are varied in opposite senses by varying the gain control voltage $U_e$, the variations of the d.c. components of the currents applied to the output terminal 21 by the transistors 1 and 25 compensate for each other, so that the d.c. level at terminal 21 remains independent of the control voltage $U_e$. The same applies to the d.c. components of the currents applied to the output terminals 22 by the transistors 5 and 26, and hence to the d.c. level at terminal 22.

By choosing unequal values for the resistors 23 and 24 it is alternatively possible to apply mutually different fractions of the current carried by lead 20 to the two output terminals. This can be done if variations of the gain control voltage $U_e$ would otherwise result in mutually different changes in the standing voltages across the output resistors 17 and 18 respectively.

It is alternatively possible to connect the collectors of the differential-amplifier transistors 1 and 5, which carry the amplified input signal, to the emitters of the transistors 25 and 26 respectively, and to interrupt the direct connections of these collectors to the output resistors 17 and 18, as is indicated in FIG. 1 by the dashed lines and crosses. If this is done the oppositely varying d.c. component as will be added to the collector currents of the transistors 1 and 5 at the emitter inputs of the transistors 25 and 26 respectively, so that these transistors, whose bases are connected to the direct voltage 27, will serve as isolating transistors between the collectors of which the output signal $U_a$ appears.

Figure 2:
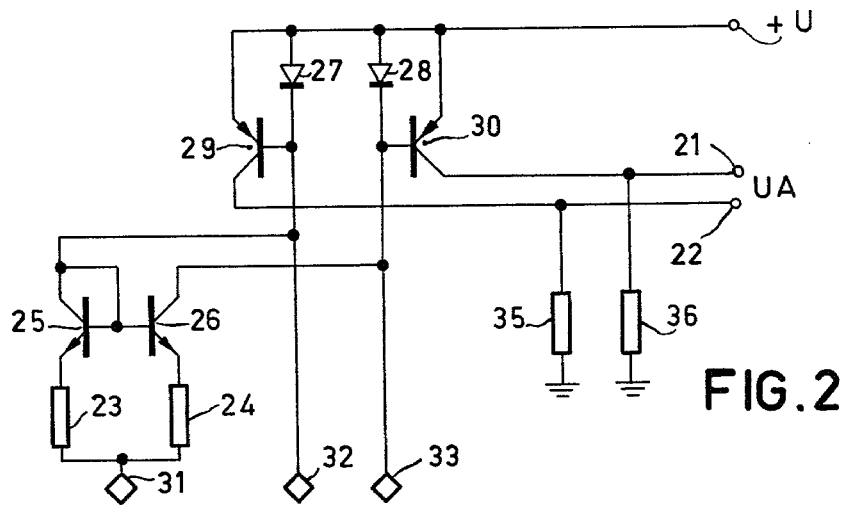
FIG. 2 shows part of a second embodiment.

FIG. 2 shows an alternative to the part of the circuit of FIG. 1 lying above the "diamonds" 31, 32 and 33. The common collector current of the transistors 2 and 6, which is applied to the circuit of FIG. 2 from the line 20 of FIG. 1 via the terminal 31, is again applied to the emitter electrodes of two isolating transistors 25 and 26 via two (preferably equal-value) resistors 23 and 24. The bases of these transistors are again interconnected, but this time they are connected to the collector of the transistor 25, so that a current mirror arrangement is formed, in a manner known per se. This current mirror configuration causes the ratio between the collector currents of the transistors 25 and 26 to be substantially equal to the inverse of the ratio between the values of the resistors 23 and 24, provided that the transistors 25 and 26 are identical apart from their base-emitter junction areas which preferably have to bear the same ratio. If said resistor values are equal and the transistors are identical, the collector currents will also be substantially equal. These collector currents are applied to the cathodes of diodes 27 and 28, respectively whose anodes are connected to the positive terminal $+U$ of the power supply source. The base-emitter junctions of pnp transistors 29 and 30 are connected in parallel with the diodes 27 and 28 respectively, the collectors of said transistors being connected to earth via load resistors 35 and 36 respectively and also to the output terminals 21 and 22 respectively.

The circuit portions formed by elements 27, 29 and 28, 30 constitute second and third current mirror arrangements (current repeater arrangements) respectively, the inputs of which are fed with the currents from the terminals 32 and 33 respectively together with the collector currents of the transistors 25 and 26, respectively, the latter currents varying in an opposite manner to the d.c. components of the currents from the terminals 32 and 33 respectively. The diodes 27 and 28 may be constituted in known manner by transistors, whose base and collector are interconnected, similarly to the transistor 25 in the current mirror 23,24,25,26. The diodes 27 and 28 serve as impedances via which the currents from the circuit points 32 and 33 (which currents contain the amplified signal components) and the currents from the transistors 25 and 26 (which currents contain the oppositely varying d.c. components) are added in such a way that the d.c. component variations cancel each other. Thus, in the output circuits of the current mirror arrangements 27, 29 and 28, 30 only the signal components are varied by varying the control voltage $U_e$, so that substantially constant d.c. levels appear on the output terminals 21 and 22.

What is claimed is:

1. A variable-gain differential amplifier circuit arrangement comprising:
   first and second long-tailed pairs of transistors, a control input, a current source circuit for controlling said control input to which said amplifier input is coupled, said current source circuit having first and second output current paths included in the tails of said first and second said long-tailed pairs respectively and being constructed so that the currents in said output current paths will vary in mutually opposite sense in response to the application of a signal to said amplifier input, first and second d.c. load impedances included in the output elecrode circuits of one transistor of said first pair and one transistor of said second pair respectively, a gain control input coupled to the control electrodes of the transistors of said first and second pairs in such manner that the application of a gain control signal to said input will result in said one transistor of said first pair and said one transistor of said second pair being driven in the same sense and in the other transistor of said first pair and the other transistor of said second pair being driven in the opposite sense, and means for maintaining the standing voltages at those terminals of said load impedances which are connected to the output electrodes of the one transistor of said first pair and the one transistor of said second pair respectively substantially independent of the value of said gain control signal, wherein said means comprises a current divider circuit to the input of which are connected to output electrodes of said other transistors of said first and second pairs, said current divider circuit having first and second outputs connected to said terminal of said first load impedance and said terminal of said second load impedance respectively.

2. An arrangement as claimed in claim 1, wherein said current divider circuit comprises a further transistor the input electrode of which is connected to said divider circuit input and the output electrode of which is connected to one of the divider circuit outputs, and a semiconductor junction included between the divider circuit input and the other of the divider circuit outputs, said semiconductor junction being connected between the control electrode of said further transistor and the divider circuit input in such a sense that it has the same polarity, as seen from the divider circuit input, as has the control electrode-input electrode junction of said further transistor.

3. An arrangement as claimed in claim 1, wherein said semiconductor junction is the control electrode-input electrode junction of a second further transistor which is of the same conductivity type as said further transistor and which has its output electrode connected to its control electrode, and wherein said first and second resistors are included in the connections between the divider circuit input and the input electrodes of said further transistor and said second further transistor respectively.

4. An arrangement as claimed in claim 2 or claim 3, wherein said first and second load impedances are formed by the input circuits of first and second current repeater circuits respectively, each of said current repeater circuit having an input current path between an input terminal thereof and being constructed to respond to the passage of a current through its input current path by carrying a current in its output current path which is linearly proportional to the current carried by its input current path and has the same sense with respect to its sum terminal as has the current carried by its input current path, the input terminals of the first and second current repeater circuits constituting the said terminals of said first and second load impedances respectively.

5. An arrangement as claimed in claim 1, wherein said current divider circuit comprises first and second further transistors connected to the input electrodes to which said divider circuit input is connected via first and second resistors respectively and the output electrodes of which are connected to the first and second outputs of said current divider circuit respectively, the control electrodes of said further transistors being connected to a constant potential point.

6. An arrangement as claimed in claim 5, wherein said output electrodes of said one transistor of said first pair and said one transistor of said second pair are connected to the input electrodes of the first and second further transistors respectively so that the connections of these output electrodes to the first and second load impedances respectively are via the output electrode-input electrode paths of said first and second further transistors respectively.

7. An arrangement as claimed in claim 1 wherein said output electrodes of said one transistor of said first pair and said one transistor of said second pair are connected directly to said first and second load impedances respectively.

* * * * *

UNITED STATES PATENT AND TRADEMARK OFFICE
CERTIFICATE OF CORRECTION

PATENT NO. : 4,360,786
DATED : November 23, 1982
INVENTOR(S) : Karl H. Rehfeldt

It is certified that error appears in the above—identified patent and that said Letters Patent is hereby corrected as shown below:

Column 5, line 27 change "1" to --2--;

Column 5, line 32 change "wherein said" to --wherein--;

Signed and Sealed this

Twenty-third Day of August 1983

[SEAL]

Attest:

GERALD J. MOSSINGHOFF

Attesting Officer

Commissioner of Patents and Trademarks